(12) United States Patent
Murakami et al.

(10) Patent No.: US 7,037,807 B1
(45) Date of Patent: May 2, 2006

(54) ELECTRIC FIELD INDUCED SPIN-POLARIZED CURRENT

(75) Inventors: Shuichi Murakami, Yokohama (JP); Naoto Nagaosa, Tokyo (JP); Shoucheng Zhang, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 10/746,050

(22) Filed: Dec. 24, 2003

(51) Int. Cl.
*H01L 21/00* (2006.01)
*H01L 21/326* (2006.01)
*H01L 21/479* (2006.01)

(52) U.S. Cl. .......................... 438/466; 438/50; 438/59; 438/73

(58) Field of Classification Search ................ 438/466, 438/59, 73, 50
See application file for complete search history.

(56) References Cited

U.S. PATENT DOCUMENTS

| | | | |
|---|---|---|---|
| 5,695,864 A * | 12/1997 | Slonczewski | 428/212 |
| 5,877,510 A | 3/1999 | Baba et al. | |
| 5,901,166 A * | 5/1999 | Nitta et al. | 372/50 |
| 6,218,718 B1 | 4/2001 | Gregg et al. | |
| 6,355,953 B1 | 3/2002 | Kirczenow | |
| 6,403,999 B1 | 6/2002 | O'Handley et al. | |
| 6,482,729 B1 | 11/2002 | Ohno et al. | |
| 2003/0075772 A1 * | 4/2003 | Efros et al. | 257/500 |

OTHER PUBLICATIONS

Murakami et al., "Dissipationless Quantum Spin Current at Room Temperature," Science 301, 1342 (2003), pp. 1-18.
M.I. D'Yakonov and V.I. Perel; "Possibility of Orienting Electron Spins with Current," JETP Letters 13, (1971), pp. 467-469.
Ohno et al., "Electrical Spin Injection in a Ferromagnetic Semiconductor Heterostructure," Nature 401, (1999), pp. 790-792.
Bulgakov et al., "Hall-Like effect Induced by Spin-Orbit Interaction," Physical Review Letters, vol. 83, No. 9, (1999), pp. 376-379.
J.E. Hirsch, "Spin Hall Effect," Physical Review Letters, vol. 83, No. 9, (1999), pp. 1834-1837.
Shufeng Zhang, "Spin Hall Effect in the Presence of Spin Diffusion," Physical Review Letters, vol. 85, No. 2, (2000), pp. 393-396.
Jairo Sinova et al., "Universal Intrinsic Spin-Hall Effect," cond-mat/0307663, (2003), pp. 1-4.

* cited by examiner

*Primary Examiner*—Chuong Anh Luu
(74) *Attorney, Agent, or Firm*—Patent Law Group LLP; Carmen C. Cook

(57) ABSTRACT

A device and a method for generating an electric-field-induced spin current are disclosed. A highly spin-polarized electric current is generated using a semiconductor structure and an applied electric field across the semiconductor structure. The semiconductor structure can be a hole-doped semiconductor having finite or zero bandgap or an undoped semiconductor of zero bandgap. In one embodiment, a device for injecting spin-polarized current into a current output terminal includes a semiconductor structure including first and second electrodes, along a first axis, receiving an applied electric field and a third electrode, along a direction perpendicular to the first axis, providing the spin-polarized current. The semiconductor structure includes a semiconductor material whose spin orbit coupling energy is greater than room temperature (300 Kelvin) times the Boltzmann constant. In one embodiment, the semiconductor structure is a hole-doped semiconductor structure, such as a p-type GaAs semiconductor layer.

45 Claims, 3 Drawing Sheets

ELECTRIC FIELD INDUCED SPIN-POLARIZED CURRENT

STATEMENT OF GOVERNMENT SPONSORED RESEARCH

The present invention was made with support from the National Science Foundation under grant no. DMR-9814289 and with support from the US Department of Energy, Office of Basic Energy Sciences, under contract DE-AC03-76SF00515. The US Government has certain rights in the invention.

FIELD OF THE INVENTION

The invention relates to a spintronic device and, in particular, to a method of generating spin-polarized electric current in non-magnetic semiconductor materials by applying an electric field.

DESCRIPTION OF THE RELATED ART

Spintronics is a field of electronics in which the spin degree of freedom of an electron is utilized for operations of devices. In particular, spintronic devices made using semiconductors have been an important subject of research because of their potential applications in low power devices with integrated logic and storage functions. While effective spin injection into semiconductors is necessary for such spintronic devices, effective spin injection using only non-magnetic semiconductors has been an elusive issue. No efficient methods of spin generation and injection in a semiconductor at room temperature have been reported up to now.

Generally, a ferromagnet is used to generate the spin current and inject the spin current into a semiconductor layer. For example, a ferromagnetic metal is often formed on a semiconductor layer for injecting spin current into the semiconductor layer. However, using ferromagnetic metals for spin injection is not practical for most semiconductor applications as ferromagnetic formation is not a common or usual semiconductor processing step and is thus more expensive to implement as specialized processing steps are required. More importantly, conductivity mismatch at the ferromagnet and semiconductor interface causes significant loss of spin polarization at the interface. Thus, only weakly spin-polarized current is injected from the ferromagnetic material into the semiconductor.

Spin injection from a ferromagnetic material into a semiconductor using a "spin filter" has also been demonstrated. U.S. Pat. No. 6,355,953 (Kirczenow) discloses using an atomically ordered interface between suitable ferromagnetic material and suitable semiconductor to create a spin filter. Depending on magnetization, spin current is either permitted or not permitted to flow through the spin filter. However, this method still requires the use of a ferromagnetic material and therefore suffers from the associated disadvantages.

Spin injection from a ferromagnetic electrode into a non-magnetic electrode through a nanocrystal doped with a single active paramagnetic ion has been demonstrated (See U.S. Patent Application 2003/0075772 to Efros et al). This kind of spintronic device requires specific and precise manufacturing steps as the electrodes and the nanocrystal have to be spaced apart at a tunneling distance. Thus, such a spintronic device is difficult to manufacture.

Spin injection from ferromagnetic semiconductors such as $Ga_{1-x}Mn_xAs$ into non-magnetic semiconductor has been demonstrated. U.S. Pat. No. 6,482,729 (Ohno et al.) discloses one such technique. Nevertheless, the operating temperature $T_c$ is at most 110 K for $Ga_{1-x}Mn_xAs$ spintronic devices which temperature is still too low for practical use at room temperature.

Thus, a spintronic device that uses conventional semiconductor material and generates spin polarized current in the absence of a magnetic field is desired.

SUMMARY OF THE INVENTION

In accordance with embodiments of the present invention, a device and a method for generating an electric-field-induced spin current is disclosed. A highly spin-polarized electric current can be generated using a semiconductor structure and an applied electric field across the semiconductor structure. The requirements to use ferromagnets or ferromagnetic semiconductor materials to generate the spin current are entirely obviated. The electric-field-induced spin current of the present invention overcomes the shortcomings of the conventional spin current generation devices using ferromagnetic materials. Another significant advantage of the present invention is that the electric-field-induced spin current can flow without dissipation, thus enabling a new generation of low power devices with integrated logic and storage capabilities.

According to one embodiment of the present invention, a device for injecting spin-polarized current into a current output terminal includes a semiconductor structure. The semiconductor structure includes a first end and an opposite second end disposed along the direction of a first axis. The semiconductor structure further includes a third end disposed along the direction of a second axis perpendicular to the first axis. A first electrode is formed on the first end of the semiconductor structure and a second electrode is formed on the second end of the semiconductor structure. The first and second electrodes are disposed to receive an applied electric field. A third electrode, being the current output terminal in the present embodiment, is formed on the third end of the semiconductor structure. The third electrode provides the spin-polarized current when an electric field is applied across the first and second electrodes. In accordance with the present invention, the semiconductor structure includes a hole-doped semiconductor structure or an undoped zero-gap semiconductor structure and includes a semiconductor material whose spin orbit coupling energy is greater than room temperature (300 Kelvin) times the Boltzmann constant.

In one embodiment, the hole-doped semiconductor structure includes a hole-doped semiconductor structure with finite bandgap or zero bandgap. In another embodiment, the semiconductor structure includes an undoped semiconductor of zero bandgap.

In another embodiment, the semiconductor structure includes a hole-doped semiconductor structure of a semiconductor material selected from the group of Si, Ge, AlAs, AlSb, GaP, GaAs, GaSb, InP, InAs, InSb, ZnSe, ZnTe, CdTe, α-Sn, HgSe, HgTe and alloys of these semiconductor materials.

In an alternate embodiment, a second electric field is applied to the semiconductor structure. The second electric field is applied between the third electrode and the current output terminal. In this manner, a spin-polarized current accompanying a charge current is generated at the current output terminal.

According to another aspect of the present invention, a spintronic device for injecting spin current into a ferromagnetic electrode, a spin LED, and a magnetic switching device can be formed using the electric-field-induced spin current of the present invention.

The present invention is better understood upon consideration of the detailed description below and the accompanying drawings.

DETAILED DESCRIPTION OF THE PREFERRED EMBODIMENTS

Figure 1:
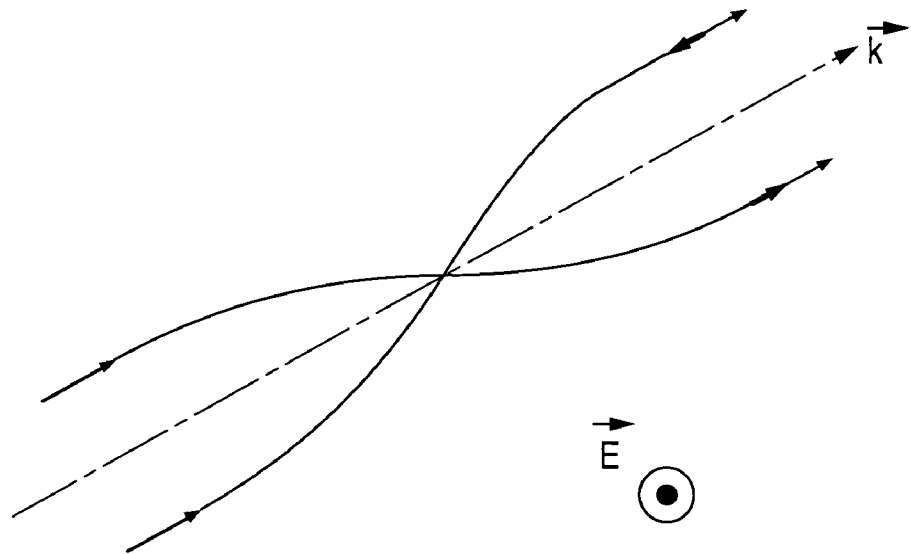
FIG. 1 shows the trajectory of the hole motion for illustrating how the hole motion is affected by the anomalous velocity drift term caused by the Berry phase.

In accordance with the principles of the present invention, a device and a method for generating a highly spin-polarized electric current utilizes a semiconductor structure and an applied electric field across the semiconductor structure. The semiconductor structure includes a hole-doped semiconductor structure of finite bandgap, a hole-doped semiconductor structure of zero bandgap, or an undoped semiconductor of zero bandgap. In one embodiment, an electric field is applied across a hole-doped semiconductor material having a strong spin orbit coupling energy to generate the spin polarized electric current. The spin current, referred herein as an "electric-field-induced spin current," can be generated at room temperature and is free from rapid relaxation of spins. Because the spin-polarized electric current is generated in a semiconductor material without the use of metallic ferromagnet or ferromagnetic semiconductor, efficient spin injection in a semiconductor can be realized as the spin current is generated inside a semiconductor material itself. As a result, a strongly spin-polarized current can be generated even at room temperature. The spin current thus generated is characterized by a long spin relaxation time making the device of the present invention suitable for practical use.

In the present technology of electronics, motions of electrons are controlled to realize various functions. In such devices, electrons are regarded merely as charged particles and a voltage is applied to move an electron's center of mass through materials. However, electrons have another degree of freedom called a spin. The electronic "spin" is a property of the electron and describes the orientation of the electron by its quantum state as "up" or "down." Spintronics is a newly developed field of electronics where the spin degree of freedom is utilized. Spintronics devices built using only semiconductors are more attractive for practical use because in semiconductors, carrier transport can be easily controlled, as in conventional diodes and transistors. In accordance with the present invention, a device and a method is disclosed for realizing efficient injection of spin-polarized electronics into semiconductors and thereby overcoming many of the limitations of the conventional spintronic devices.

In one embodiment, the device and associated method of the present invention realize an electric-field-induced spin current in conventional hole-doped (p-type) semiconductors. In hole-doped semiconductors, the structure of the valence bands plays major roles in the realization of the present invention. The valence bands in semiconductors with diamond or zincblende structure are made up of p orbitals, and are six-fold degenerate at wavevector k=0. The spin-orbit coupling leads to a splitting of valence bands into four-fold degenerate $P_{3/2}$ and two-fold degenerate $P_{1/2}$ levels. In a large class of semiconductors, including Si, Ge, GaAs and InSb, the $P_{3/2}$ levels form the top of the valence bands, which are separated from S-like conduction bands. Therefore, the valence bands are four-fold degenerate at k=0. These four bands are described by the Hamiltonian known as Luttinger Hamiltonian. For a given wave vector k, the Hamiltonian has two eigenvalues, where each eigenvalue is doubly degenerate. Each doublet is a Kramers doublet, whose degeneracy is ensured by the time reversal and inversion symmetry of the Hamiltonian. They are referred to as the light-hole (LH) and heavy-hole (HH) bands in semiconductors. The light-hole and the heavy-hole bands are split because of the spin-orbit interaction among the $P_{3/2}$ levels. The two energy levels cross at the band center k=0. In semiconductors with zincblende structure, such as GaAs, inversion symmetry breaking causes an additional splitting in the LH and HH bands. This splitting is quite small and can be neglected at room temperature.

The spintronic device of the present invention utilizes the effect of the spin-orbit coupling. The spin-orbit coupling gives rise to various phenomena in physics. In an article entitled "Dissipationless Quantum Spin Current at Room Temperature," published in Science 301, 1348 (2003), authored by the same inventors hereof, the inventors disclosed that in conventional hole-doped semiconductors, the spin-orbit coupling causes a spin-polarized current by applying only an electric field. The size of the effect was evaluated and the inventors found that the spin-polarized current is almost the same or even more than the usual charge current.

It has been known that this physical phenomenon occurs also by the extrinsic spin-orbit coupling between the electron and the random impurity atoms. This extrinsic effect is therefore proportional to the amount of "dirt" in the system, which is very small in the high purity semiconductor materials employed in the semiconductor industry today. The reliance on "dirt" also has unwanted side effects on the transport properties and the performance of the device. To the contrary, the inventors of the present invention are the first to present findings in the aforementioned Science paper where the spin-polarized current is generated by the intrinsic spin-orbit coupling between the electrons and the applied electric field. This intrinsic effect is sufficiently large for practical use and is free from dissipation from impurities.

The electric field induced spin current can be quantitatively understood in terms of the "Berry's phase" accumulated by the electron motion. The Berry phase effect requires a coupling of spin and orbital motion of electrons, i.e. the spin-orbit coupling. Depending on the spin direction of the hole, together with the lattice effect, the hole motion will obtain an additional component coming from the Berry phase. This additional motion is perpendicular to both the wavevector k and the applied electric field E, and is opposite for the opposite orientations of spins. Semiclassical equation of motion for the hole is written as:

$$\hbar \dot{k} = eE, \quad \dot{x} = \frac{1}{\hbar}\frac{\partial E(k)}{\partial k} + \dot{k} \times F(k), \quad (1)$$

where F(k) is a curvature term coming from the Berry phase effect. The Berry curvature F(k) is determined from the wavefunction. For example, in the Luttinger Hamiltonian together with the spherical approximation, this F(k) is proportional to $|k|^{-3}k$. It becomes larger when k approaches zero, which is a result of the k-space structure of wavefunctions having a monopole at k=0 coming from touching of the light-hole and heavy-hole bands there.

FIG. 1 shows the trajectory of the hole motion for illustrating how the hole motion is affected by this Berry-phase term. The trajectory can be obtained by integrating equation (1) over the time t. Referring to FIG. 1, the two arrows denote the direction of the spins. The last term in equation (1) causes a spin current perpendicular to both the electric field E and the direction of the spin S. For example, by applying an electric field $E_z$ along the z-axis, the spin current at zero temperature, with spin parallel to the x axis, flowing to the y direction is given by:

$$j_{xy} = \frac{eE_z}{12\pi^2}(3k_F^H - k_F^L), \quad (2)$$

where $k_F^H$ and $k_F^L$ are the Fermi wavevector of the heavy-hole and light-hole bands, respectively. The spin current equation is rotationally invariant, with the covariant form given by:

$$j_{ij} = \sigma_s \epsilon^{ijk} E_k, \quad (3)$$

where $\epsilon^{ijk}$ is a fully antisymmetric tensor with $\epsilon^{xyz}=1$. More recently, a full quantum mechanical calculation based on the Kubo formula by the same authors hereof finds a quantum correction to the semiclassical result of equation (2), where the spin conductivity is given by $$\sigma_s = \frac{e}{6\pi^2}(k_F^H - k_F^L).$$

The fundamental response equation (3) is invariant under the reversal of the arrow of time, and shows that it is possible to induce a dissipationless spin current by an electric field in conventional semiconductors. That is, the spin of the electrons can be transported without any loss of energy, or dissipation. In one embodiment, an electric field along the z direction can induce a spin current along the y direction, with the spin polarization aligned in the x direction. Although actual motion of holes is intervened by scatterings coming from impurities, electron—electron interaction and so forth, the spin current itself is not affected by these scattering events. In other words, the spin conductivity given by equation (2) is completely independent of the mean free path and relaxation rates, and all states below the Fermi energy contribute to the spin current.

The size of the spin current can be estimated. In p-GaAs with the hole density $n=10^{19}$ cm$^{-3}$, the mobility of the holes at room temperature is $\mu=50$ cm$^2$/Vsec. This value corresponds to the conductivity a $\sigma=en\mu\sim80\Omega^{-1}$cm$^{-1}$. The unit of the spin conductivity $\sigma_s$ is converted to be the same as that of the conductivity to facilitate comparison. A term $\sigma'_s$ is defined as $\sigma'_s=(2e/\hbar)\sigma_s$ and can be roughly estimated as $$\sigma'_s \sim \frac{e^2}{\hbar}n^{1/3} \sim 80\Omega^{-1}\text{cm}^{-1}.$$

Therefore $\sigma$ and $\sigma'_s$ are of the same order for $n=10^{19}$ cm$^{-3}$. For lower carrier concentration, $\sigma'_s$ becomes larger than $\sigma$. For $n=10^{16}$ cm$^{-3}$, for example, $\sigma\sim0.6\Omega^{-1}$cm$^{-1}$ and $\sigma'_s\sim7\Omega^{-1}$cm$^{-1}$.

As discussed above, the present invention discloses the generation of a dissipationless spin current in a hole-doped semiconductor, including semiconductor of either finite (non-zero) or zero bandgap, or an undoped semiconductor of zero bandgap by an electric field. The electric-field-induced spin-polarized electric current can be applied to build various spintronic devices. The following description discusses several embodiments of spintronic devices which can be built using the electric-field-induced spin current of the present invention. Of course, the description below is illustrative only and one of ordinary skill in the art would appreciate that other spintronic devices can be built based on these principles to enable the construction of more sophisticated computing devices.

Spin Injection into Semiconductor Devices

Figure 2:
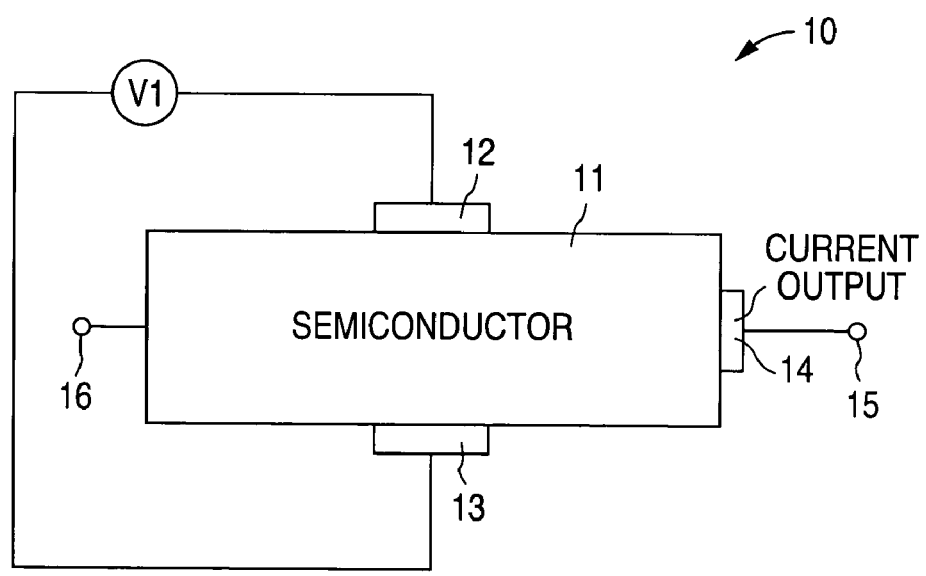
FIG. 2 is a schematic diagram illustrating a spintronic device for injecting an electric-field-induced spin current into semiconductors according to one embodiment of the present invention.

FIG. 2 is a schematic diagram illustrating a spintronic device for injecting an electric-field-induced spin current into semiconductors according to one embodiment of the present invention. Because the spin current of the present invention is generated in a semiconductor material, the spin current is particularly useful for spin injection into semiconductors. In contrast with spin injection into semiconductors from metallic ferromagnet, spin injection using the electric-field-induced spin current of the present invention is free from the problems of conductance mismatch as the injector and the recipient of the spin current are both semiconductors. In other words, by generating the spin current in a semiconductor material, the spin current can be efficiently transported to other regions of the semiconductor, minimizing or eliminating loss of spin polarization.

Referring to FIG. 2, a spintronic device 10 for spin injection into semiconductors is shown. Spintronic device 10 includes a hole-doped semiconductor structure 11 having a first end and an opposite second end disposed on a first axis. A first electrode 12 is formed on the first end and a second electrode 13 is formed on the second end of the semiconductor structure. Semiconductor structure 11 further includes a third end disposed along the direction of a second axis perpendicular to the first axis. A third electrode 14 is formed on the third end and forms a current output terminal 15 of the spintronic device. To inject spin current into a recipient semiconductor material, the recipient semiconductor material (not shown) can be coupled across terminal 15 and a terminal 16, opposite and on the same axis as terminal 15, of spintronic device 10.

When an electric field V1 is applied across first and second electrodes 12 and 13, a spin current (spin-polarized holes or spin-polarized electrons) will flow out of current output terminal 15. The spin current can thus be injected into the desired recipient semiconductor material by coupling the recipient semiconductor material to terminals 15 and 16.

In the present description, the terms "spin current" and "spin-polarized current" are used to refer to the current generated as a result of the manipulation and transport of the electron spin. In general, there are two types of spin currents. A "pure" spin current refers to a spin current where the up spin and down spin are exactly equal and counter propagate. Thus, there is no net electric current. On the other hand, a spin-polarized current exists where there are more up-spin moving in one direction than down-spin in the same direction. Thus, there is an electric current flowing but the current is spin polarized. In other words, the spin current accompanies a charge current. In the present description, the terms "spin current" and "spin-polarized current" refer to both types of spin current: the pure spin current and the spin-polarized current with a charge current.

Figure 3:
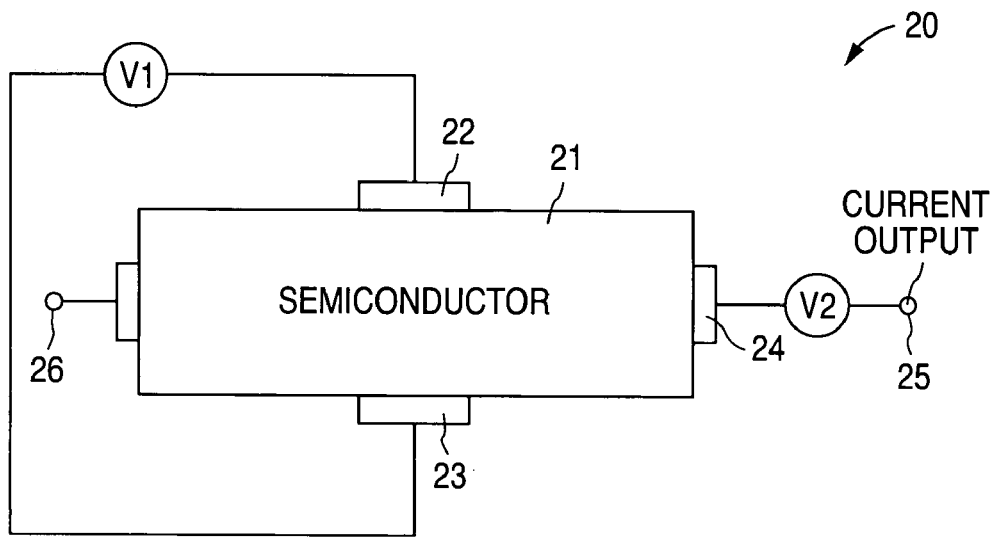
FIG. 3 is a schematic diagram illustrating a spintronic device for injecting an electric-field-induced spin current into semiconductors according to an alternate embodiment of the present invention.

FIG. 3 is a schematic diagram illustrating a spintronic device for injecting an electric-field-induced spin current into semiconductors according to an alternate embodiment of the present invention. The spintronic device of FIG. 2 generates a spin-polarized current that is a pure spin current by the application of an electric field across first and second electrodes 12 and 13. On the other hand, the spintronic device of FIG. 3 generates a spin-polarized current that accompanies a charge current by applying two electric fields in perpendicular direction to each other.

Referring to FIG. 3, spintronic device 20 includes a hole-doped semiconductor structure 21 having a first end and an opposite second end disposed on a first axis. A first electrode 22 is formed on the first end and a second electrode 23 is formed on the second end of the semiconductor structure. A first electric field V1 is applied across the first and second electrodes. Semiconductor structure 21 further includes a third end and a fourth end disposed along the direction of a second axis perpendicular to the first axis. A third electrode 24 is formed on the third end of semiconductor device 21. In the present embodiment, a second electric field V2 is applied across third electrode 24 and a current output terminal 25 of the spintronic device. To inject spin current into a recipient semiconductor material, the recipient semiconductor material (not shown) can be coupled across current output terminal 25 and a fourth electrode 26 formed on the fourth end of spintronic device 20.

In spintronic device 20, a second electric field V2 is applied between third electrode 24 and current output terminal 25. The second electric field, together with the first electric field, generates a spin polarized current at current output terminal 25 that is accompanied by a charge current.

The hole-doped semiconductor structure used in spintronic devices 10 and 20 of FIGS. 2 and 3 can be a p-type semiconductor made of a semiconductor material whose spin orbit coupling energy is greater than room temperature (300 Kelvin) times the Boltzmann constant ($k=1.38\times10^{-23}$ J/K). In one embodiment, the semiconductor material has a spin orbit coupling energy that is greater than approximately 30 meV.

In one embodiment, the hole-doped semiconductor structure includes a p-type semiconductor structure having a doping level of approximately $10^{16}$ to $10^{20}$ atoms/cm$^3$.

Furthermore, in one embodiment, the electric field V1 applied across the first and second electrodes is a DC electric field in the range of $10^3$ V/cm to $10^6$ V/cm. In other embodiments, the electric field V1 can be an AC electric field.

As a result of the application of the first electric field V1 (FIG. 2) or the first and second electric fields V1 and V2 (FIG. 3), a spin current is generated and can be injected into a recipient semiconductor structure. In FIGS. 2 and 3, the recipient semiconductor structure into which spin current is injected is not shown. In most applications, the recipient semiconductor structure and the hole-doped semiconductor structure are formed as an integral semiconductor device, such as an integrated circuit. As such, the third electrode shown in FIGS. 2 and 3 is illustrative only and does not depict an actual physical implementation of the third electrode. In actual implementation, the third electrode is merely the interface between the hole-doped semiconductor structure and the recipient semiconductor structure.

Moreover, the spin current can be injected into a recipient semiconductor structure of either p-type or n-type conductivity. In particular, it is generally more desirable to inject spin current into n-type semiconductors because the spin relaxation time for electrons is much longer than that of holes. For instance, the spin lifetime of electrons in GaAs is of the order of 100 psec at room temperature, $10^3$ times longer than that of holes, and by suppressing the D'yakonov-Perel' mechanism, which is one of the major mechanisms for spin relaxation, the spin relaxation time could be even as long as 2 nsec.

As mentioned above, spin injection from ferromagnetic semiconductors, such as (Ga,Mn)As, into n-GaAs through the p-n junction has been successfully demonstrated. However, the prior art structure requires the use of a ferromagnetic semiconductor. The spin injection generated by the spintronic devices of the present invention is achieved by replacing the ferromagnetic semiconductor (Ga,Mn)As with a conventional hole-doped semiconductor layer, such as a p-GaAs layer under an electric field. By eliminating the use of a ferromagnet, the spintronic device of the present invention can be manufactured using standard semiconductor fabrication processes and can be readily applied to construct various types of computing devices.

Spin Injection Device Into Ferromagnet

Figure 4:
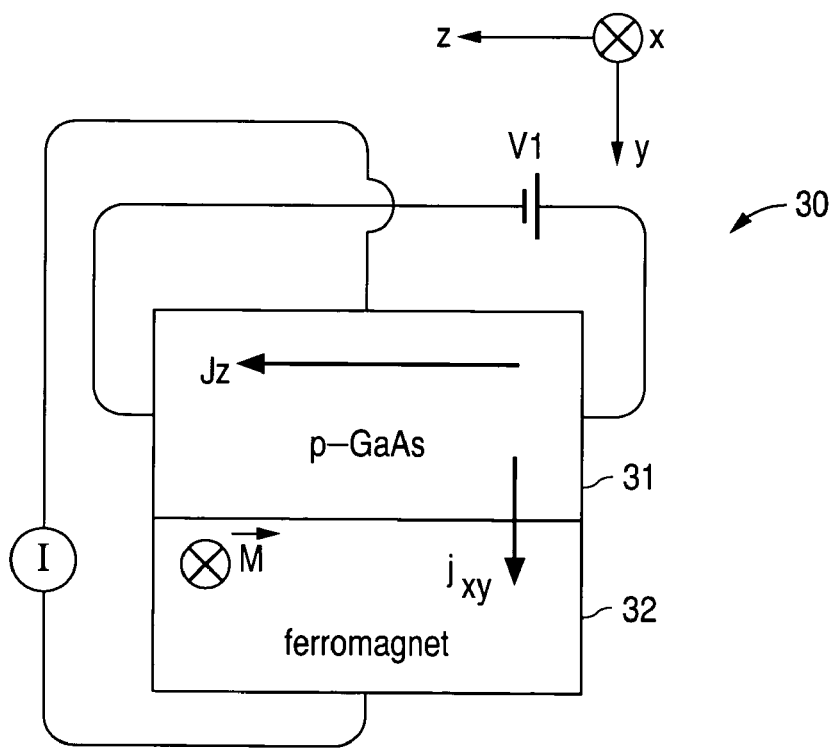
FIG. 4 is a schematic diagram of a spin injection device for injecting a spin current into a ferromagnetic electrode according to one embodiment of the present invention.

According to one embodiment of the present invention, a spin injection device into a ferromagnetic electrode can be constructed using the electric-field-induced spin current of the present invention. FIG. 4 is a schematic diagram of a spin injection device for injecting a spin current into a ferromagnetic electrode according to one embodiment of the present invention. Referring to FIG. 4, a spin injection device 30 includes a hole-doped semiconductor structure 31 attached to a ferromagnetic electrode 32. The magnetization of the ferromagnetic electrode 32 is along ±x-direction. In the present embodiment, the hole-doped semiconductor structure 31 is a p-type GaAs layer having first and second electrodes disposed along the z-direction for receiving an applied electric field V1.

When the electric field is applied along the z-direction between the first and second electrodes, an electric current $J_Z$ is induced in the spin injection device 30 and a spin current $j_{xy}$ will flow along the +y direction. The electric current I, flowing out of the ferromagnetic electrode 32, is a function of the direction of magnetization M.

Although ferromagnetic metals can be used as the ferromagnetic electrode 32, the use of ferromagnetic metals to receive the spin current is not efficient due to conductance mismatch between the metal and the semiconductor structure. The spin polarization will be reduced at the metal-semiconductor boundary. Alternately, doped ferromagnetic semiconductors are more suitable for use with the spin injection device 30 since the conductance mismatch between the doped ferromagnetic semiconductor and the semiconductor structure is lessened.

By attaching spin injection device 30 to the ferromagnetic electrode 32, the spin current $j_{xy}$ induces an electric current I when the magnetization of the ferromagnet is along +x-direction while less current is observed for magnetization in the −x-direction. In realistic situation, the ratio of the electric currents I(+x)/I(−x) is determined by that of the tunneling probabilities for parallel and anti-parallel spins at the interface with the electrode. This ratio is still expected to be well larger than unity. This difference can be used as a read head for magnetic data storage, as will be described in more detail below with respect to magnetic switching devices.

Spin LED

Figure 5:
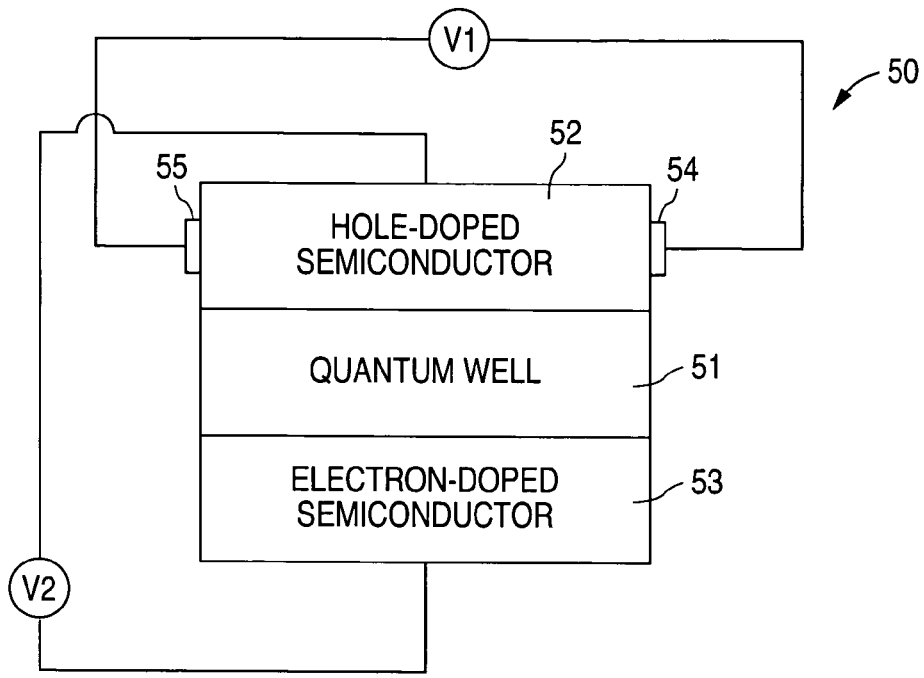
FIG. 5 is a schematic diagram of a spin LED according to one embodiment of the present invention.

According to another embodiment of the present invention, the electric-field-induced spin current is used to construct a spin light emitting device (spin LED). FIG. 5 is a schematic diagram of a spin LED according to one embodiment of the present invention. Referring to FIG. 5, a quantum well structure 51 is sandwiched between a hole-doped (p-type) semiconductor layer 52 and an electron-doped (n-type) semiconductor layer 53. First and second electrodes 54, 55 are attached on opposite sides of hole-doped semiconductor layer 52 and a first electric field V1 is applied across the first and second electrodes 54, 55. A second electric field V2 is applied between the hole-doped semiconductor layer 52 and the electron-doped (n-type) semiconductor layer 53 for guiding the holes into the quantum well.

When electric field V1 is applied between the first and second electrodes 54, 55, the spin current, that is, spin-polarized holes, will flow into the quantum well. The spin-polarized holes will recombine with electrons coming from the electron-doped semiconductor layer 53. As a result, a circularly polarized light is emitted from the quantum-well layer 51.

Prior to the present invention, spin LED can only be made using ferromagnetic semiconductor. For example, a prior art spin LED structure has been proposed where the quantum well structure of (In,Ga)As is sandwiched by p-type (Ga, Mn)As and n-GaAs. However, in accordance with the present invention, ferromagnetic semiconductor is not needed. Instead, a conventional p-type semiconductor layer under and electric field is used to replace the ferromagnetic dilute semiconductor (Ga,Mn)As used in the prior art devices. The spin LED thus formed is more conducive to practical implementation.

The hole-doped (p-type) semiconductor layer 52 of spin LED 50 can be constructed in the same manner as described above with reference to the hole-doped semiconductor structure of the spintronic devices of FIGS. 2 and 3. In particular, the hole-doped (p-type) semiconductor layer includes a semiconductor material whose spin orbit coupling energy is greater than room temperature (300 Kelvin) times the Boltzmann constant. In one embodiment, the semiconductor material has a spin orbit coupling energy that is greater than approximately 30 meV.

Magnetic Switching Device

According to another embodiment of the present invention, the electric-field-induced spin current is used to construct a magnetic switching device. When spin current is injected into a ferromagnet, the spin current will exert a torque on the magnetization of the ferromagnet. By exploiting the effect that the magnetization of a ferromagnet can be controlled by a spin current, a magnetic switching device can be derived with the ferromagnet being the media for recording data. U.S. Pat. No. 5,695,864 to J. C. Slonczewski describes such a magnetic switching device. The magnetic switching device described in the '864 patent involves attaching a second ferromagnet with fixed magnetization and injecting spin-polarized current from the fixed magnetization ferromagnet into the first ferromagnet acting as the recording medium. In contrast to the prior art device, a magnetic switching device can be constructed using the electric-field-induced spin current of the present invention in place of the fixed magnetization ferromagnet. Thus, the magnetic switching device does not include any magnetic elements except for the ferromagnetic recording media itself. By eliminating the ferromagnet used to generate the spin current, the magnetic switching device of the present invention has advantages in magnetic recording applications because the switching device is free from errors caused by switching other recorded bits by mistake.

Figure 6:
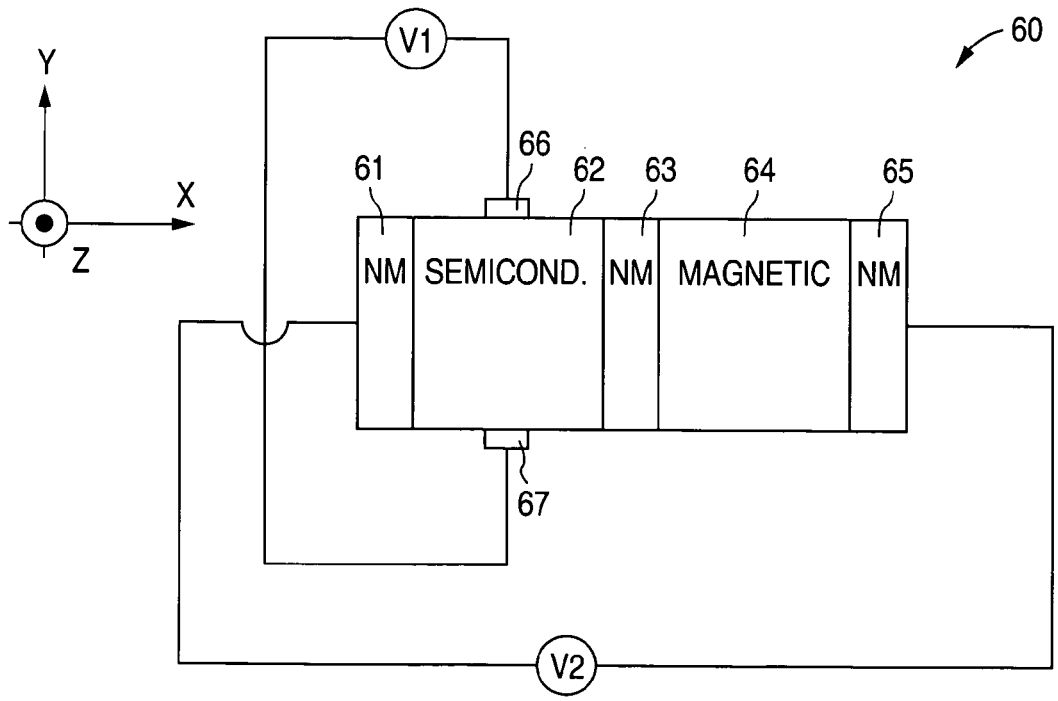
FIG. 6 is a schematic diagram of a spin-current induced magnetic switching device according to one embodiment of the present invention.

FIG. 6 is a schematic diagram of a spin-current induced magnetic switching device according to one embodiment of the present invention. Referring to FIG. 6, magnetic switching device 60 includes five layers: a nonmagnetic conductor layer 61, a hole-doped semiconductor layer 62, a nonmagnetic conductor layer 63, a magnetic conducting layer 64 and a nonmagnetic conductor layer 65. The two nonmagnetic conductor layers 61 and 65 serve as electrodes, and an electric field V2 is applied between the electrodes to introduce an electric current flowing through these five layers. The electric field V2 functions as a current supply and can be in the form of an applied voltage or an applied current (that is, a voltage source or a current source). The magnetic conducting layer 64 is either ferromagnetic or ferrimagnetic, having a spontaneous or changeable magnetic moment. The easy axis of the magnetization of magnetic layer 64 has been put to the z direction.

Hole-doped semiconductor layer 62 includes electrodes 66 and 67 disposed on opposite ends thereof (the y-direction). By applying an electric field V1 on the semiconductor layer 62 in the vertical (y) direction through electrodes 66 and 67, a spin current will flow into the magnetic layer 64 through the nonmagnetic conductor layer 63. The spins of this spin current are aligned along the z direction. Therefore this spin current will reverse the magnetization of the magnetic layer 64 if the initial magnetization of the magnetic layer is antiparallel to the spin direction of the spin current. Mathematically, if they are exactly antiparallel, there will occur no magnetization switching. Nevertheless, in reality there is disorder and thermal fluctuation of the magnetization, causing a slight change of the magnetization direction, and magnetization switching always takes place.

The spin direction of the spin current can be reversed by inverting the sign of the applied electric field V1 between the electrodes 66 and 67. By controlling the spin direction, the magnetization of the magnetic layer 64 can be controlled. By regarding the +z and −z magnetization as 0 and 1, the two magnetization states can serve as one "bit" in a magnetic data storage application.

The hole-doped semiconductor layer 62 of magnetic switching device 60 can be constructed in the same manner as described above with reference to the hole-doped semiconductor structure of the spintronic devices of FIGS. 2 and 3. In particular, the hole-doped (p-type) semiconductor layer includes a semiconductor material whose spin orbit coupling energy is greater than room temperature (300 Kelvin) times the Boltzmann constant. In one embodiment, the semiconductor material has a spin orbit coupling energy that is greater than approximately 30 meV.

Furthermore, in FIG. 6, the non-magnetic conductor layers 61 and 63 are shown as separate layers from the hole-doped semiconductor layer 62. However, in actual implementation, the non-magnetic conductor layers 61 and 63 can merely be integral parts of the hole-doped semiconductor layer 62. That is, layers 61, 62 and 63 can be replaced by a single non-magnetic hole-doped semiconductor layer. In conventional magnetic devices using a fixed magnetization ferromagnet for generating the spin current, the non-magnetic conductor layer 61 is used to form an electrode for receiving the electric field V2 and the non-magnetic conductor layer 63 is used to isolate the spin-generating ferromagnet and the ferromagnet recording medium. However, in accordance with the present invention, because no ferromagnetic material is used for spin generation and the spin generation is provided by a semiconductor material under an electric field, the semiconductor material can form the electrode for receiving the applied electric field V2 and can also form the interface to the magnetic layer 64.

Advantages

The electric-field-induced spin current of the present invention provides many advantages over conventional devices and method for generating spin current. As compared to prior art devices, the electric-field-induced spin current of the present invention improves appreciably the efficiency of spin injection into semiconductors. Furthermore, the electric-field-induced spin current is non-dissipative, and does not accompany any Joule heating. The non-dissipative nature of the spin current is a feature that is useful in building electronics devices with low power consumption.

Another advantage of the electric-field-induced spin current is that the magnitude of the spin current is considerably large, even at room temperature. Equation (2) above describes the spin current at zero temperature. For finite temperature, the equation is modified only through the Fermi distribution function. For example, for GaAs at room temperature with n=$10^9$ cm$^{-3}$, the nominal value of the energy difference between the light-hole (LH) and heavy-hole (HH) bands at the same wavenumber is 0.1 eV, and it largely exceeds both the temperature (~0.025 eV) and the width of the energy levels broadened by a momentum relaxation $\hbar/\tau_p$~0.006 eV. Thus the value of the spin current remains of the same order as in the zero temperature.

An important advantage of the electric-field-induced spin current of the present invention is that the spin-polarized current does not undergo rapid relaxation of spins. It is known that the hole spins relax very rapidly to an unpolarized state, with the short relaxation time $\tau_s$~100 fsec at room temperature. This is because the rapid momentum relaxation always accompanies the spin relaxation, due to the strong spin-orbit interaction in the valence band.

Nevertheless, in the steady state, a spin current induced by an electric field is free from such rapid relaxation of spins of holes. The electric-field-induced spin current is a purely quantum mechanical effect with equilibrium spin/momentum distribution. Thus, the electric-field-induced spin current is not affected by the rapid relaxation of hole spins. Only when the spin/momentum distribution deviates from equilibrium, for example, in the case of spin accumulation at the boundaries of the semiconductor structure, will the rapid relaxation of holes become effective.

Another important advantage of the electric-field-induced spin current of the present invention is that the spin-polarized current can be injected into other semiconductor structures or materials without suffering the conductivity mismatch problem typically associated with ferromagnetic spin injecting devices. Furthermore, because the amount of carrier doping in the semiconductor structure can be adjusted, the doping level can be selected to match the conductivity of the recipient semiconductor device. Thus, any conductance mismatch can be strictly minimized.

Alternate Embodiments and Modifications

In the embodiments described above, the hole-doped semiconductor structure used to form the spintronic device of the present invention is sometimes implemented as a p-type GaAs. The use of GaAs as the hole-doped semiconductor structure is illustrative only and other semiconductor materials can also be used. For instance, other semiconductors whose highest valence band is a fourfold degenerate p$^{3/2}$ band at $\Gamma$ point in the cubic lattice, namely $\Gamma_5$ in the absence of the spin-orbit coupling or $\gamma_8$ in the presence of it, can be used as well. This class contains Si, Ge, AlAs, AlSb, GaP, GaAs, GaSb, InP, InAs, InSb, ZnSe, ZnTe, CdTe, C(diamond), AlP, BP, BAs and their alloys. Hence, by using hole-doped semiconductors described above, an electric-field-induced spin current can be generated. In particular, semiconductor materials with spin-orbit coupling energy larger than the thermal energy at room temperature (300 K), i.e., the room temperature times the Boltzmann constant, are ideal because the electric-field-induced spin current survives at room temperature. This class of hole-doped semiconductors includes Si, Ge, AlAs, AlSb, GaP, GaAs, GaSb, InP, InAs, InSb, ZnSe, ZnTe, CdTe and their alloys.

In some semiconductors including α-Sn, HgSe and HgTe, the fourfold degenerate band $\Gamma_8$ at the $\Gamma$ point are split into a conduction band and a valence band, both having twofold degeneracy. They are called zero-gap semiconductors which refer to semiconductors with a zero bandgap. These semiconductors are also among the materials that can be used to generate the electric-field-induced spin current in accordance with the present invention. When the zero-gap semiconductors are used, the electric-field-induced spin current can be generated with or without carrier doping of the semiconductor structure. Thus, in some embodiments of the present invention, an undoped semiconductor material can be used to generate the electric-field-induced spin current.

Furthermore, the hole-doped semiconductor structure used for generating the electric-field-induced spin current can be formed in a bulk or in a layer. That is, the semiconductor structure can be formed in a three-dimensional form or in a two-dimensional form.

Also, in the above embodiments, the term "axis" is used to describe the relative direction of the applied electric field, the spin polarization and the resultant spin current. For example, the electric field is applied in a first axis while the spin current flows in the second axis, the second axis being perpendicular to the first axis. The spin polarization is in the direction of a third axis perpendicular to both the first and the second axes. Moreover, in some cases, the above description uses the Cartesian coordinates (x,y,z) to describe the directional relationship of the electric field, the spin current and the spin polarization as in three perpendicular axes. However, the term "axis" used in the present description and in the claims is not intended to restrict the present invention to operate in a Cartesian coordinate system only. Rather the term "axis" is used herein to describe the main line of motion of the respective subject matter (e.g. electric field or spin current).

In addition, the use of the Cartesian coordinates (x,y,z) in the present description is illustrative only and is not intended to limit the practice and implementation of the electric-field induced spin current of the present invention in the Cartesian coordinate space only. In particular, the spin current equation (3) derived above is independent of any specific coordinate systems. Thus, the directional relationship of the three perpendicular axes of the electric field, the spin current and the spin polarization can be expressed in any coordinate systems that describe positional relationship in the three dimensional space. In one embodiment, the three perpendicular axes of the electric field, the spin current and the spin polarization is expressed in the cylindrical coordinates (r,φ,z).

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A device for injecting spin-polarized current into a current output terminal comprising:
   a semiconductor structure comprising;
      a first end and an opposite second end disposed along the direction of a first axis, and a third end disposed along the direction of a second axis perpendicular to the first axis;
      a first electrode formed on the first end of the semiconductor structure;
      a second electrode formed on the second end of the semiconductor structure, wherein the first and second electrodes are disposed to receive an applied electric field; and
      a third electrode being the current output terminal formed on the third end of the semiconductor structure, the third electrode providing the spin-polarized current when an electric field is applied across the first and second electrodes,
   wherein the semiconductor structure comprises a hole-doped semiconductor structure or an undoped zero-gap semiconductor structure and further comprises a semiconductor material whose spin orbit coupling energy is greater than room temperature (300 Kelvin) times the Boltzmann constant.

2. The device of claim 1, wherein the semiconductor structure comprises a hole-doped semiconductor structure of finite bandgap or zero bandgap.

3. The device of claim 2, wherein the hole-doped semiconductor structure comprises a semiconductor material selected from the group of Si, Ge, AlAs, AlSb, GaP, GaAs, GaSb, InP, InAs, InSb, ZnSe, ZnTe, CdTe, α-Sn, HgSe, HgTe and alloys of these semiconductor materials.

4. The device of claim 1, wherein the semiconductor structure comprises an undoped zero-gap semiconductor structure selected from the group of semiconductor materials with zero bandgap.

5. The device of claim 4, wherein the undoped zero-gap semiconductor structure comprises a semiconductor material selected from the group of α-Sn, HgTe and HgSe.

6. The device of claim 1, wherein the semiconductor structure comprises a semiconductor material whose spin orbit coupling energy is greater than approximately 30 meV.

7. The device of claim 2, wherein the hole-doped semiconductor structure comprises a p-type semiconductor structure having a doping level of approximately $10^{16}$ to $10^{20}$ atoms/cm$^3$.

8. The device of claim 1, wherein the electric field applied across the first and second electrodes comprises a DC electric field in the range of $10^3$ V/cm to $10^6$ V/cm applied across the first and second electrodes.

9. The device of claim 1, wherein the electric field applied across the first and second electrodes comprises an AC electric field applied across the first and second electrodes.

10. The device of claim 1, wherein the spin-polarized current has a spin polarization aligned in the direction of a third axis, the third axis being perpendicular to the first axis and to the second axis.

11. The device of claim 10, wherein the first axis, the second axis and the third axis have directional relationship described in Cartesian coordinates.

12. The device of claim 10, wherein the first axis, the second axis and the third axis have directional relationship described in cylindrical coordinates.

13. The device of claim 1, wherein the semiconductor structure further comprises a fourth end opposite to the third end, the semiconductor structure providing the spin-polarized current to a recipient semiconductor structure coupled across the third end and the fourth end of the semiconductor structure.

14. The device of claim 13, wherein the semiconductor structure and the recipient semiconductor structure are formed as an integral semiconductor structure.

15. A device for injecting spin-polarized current into a current output terminal comprising:
   a semiconductor structure comprising a hole-doped semiconductor structure or an undoped zero-gap semiconductor structure and further comprising a semiconductor material whose spin orbit coupling energy is greater than room temperature (300 Kelvin) times the Boltzmann constant, the semiconductor structure comprising:
      a first end and an opposite second end disposed along the direction of a first axis, and a third end and an opposite fourth end disposed along the direction of a second axis perpendicular to the first axis;
      a first electrode formed on the first cad of the semiconductor structure;
      a second electrode formed on the second end of the semiconductor structure, wherein the first and second electrodes are disposed to receive a first applied electric field; and
      a third electrode formed on the third end of the semiconductor structure, wherein the third electrode and the current output terminal are disposed to receive a second applied electric field,
   wherein the third electrode provides the spin-polarized current at the current output terminal when the first electric field is applied across the first and second electrodes, and the second electric field is applied across the third electrode and the current output terminal.

16. The device of claim 15, wherein the semiconductor structure comprises a hole-doped semiconductor structure of finite bandgap or zero bandgap.

17. The device of claim 15, wherein the semiconductor structure comprises a semiconductor material whose spin orbit coupling energy is greater than approximately 30 meV.

18. The device of claim 16, wherein the hole-doped semiconductor structure comprises a semiconductor material selected from the group of Si, Ge, AlAs, AlSb, GaP, GaAs, GaSb, InP, InAs, InSb, ZnSe, ZnTe, CdTe, α-Sn, HgSe, HgTe and alloys of these semiconductor materials.

19. The device of claim 16, wherein the hole-doped semiconductor structure comprises a p-type semiconductor structure having a doping level of approximately $10^{16}$ to $10^{20}$ atoms/cm$^3$.

20. The device of claim 15, wherein the semiconductor structure comprises an undoped zero-gap semiconductor structure selected from the group of semiconductor materials with zero bandgap.

21. The device of claim 20, wherein the undoped zero-gap semiconductor structure comprises a semiconductor material selected from the group of α-Sn, HgTe and HgSe.

22. A spintronic device comprising:
 a semiconductor structure comprising:
  a first electrode formed on a first end of the semiconductor structure;
  a second electrode formed on a second end opposite to the first end of the semiconductor structure, the first end and the second end being disposed along the direction of a first axis; and
  a third electrode formed on a third end of the semiconductor structure, the third end being disposed along the direction of a second axis perpendicular to the first axis, the third electrode providing a spin-polarized current when an electric field is applied across the first and second electrodes,
  wherein the semiconductor structure comprises a hole-doped semiconductor structure or an undoped zero-gap semiconductor structure and further comprises a semiconductor material whose spin orbit coupling energy is greater than room temperature (300 Kelvin) times the Boltzmann constant; and
 a ferromagnetic structure coupled to the third electrode of the semiconductor structure for receiving the spin-polarized current, the ferromagnetic structure having a first magnetization direction and a second magnetization direction opposite to the first magnetization direction,
 wherein the spin-polarized current flows in the ferromagnetic structure when the ferromagnetic structure has the first magnetization direction and the spin-polarized current is reduced in the ferromagnetic structure when the ferromagnetic structure has the second magnetization direction.

23. The device of claim 22, wherein the semiconductor structure comprises a hole-doped semiconductor structure of finite bandgap or zero bandgap.

24. The device of claim 22, wherein the semiconductor structure comprises a semiconductor material whose spin orbit coupling energy is greater than approximately 30 meV.

25. The device of claim 23, wherein the hole-doped semiconductor structure comprises a semiconductor material selected from the group of Si, Ge, AlAs, AlSb, GaP, GaAs, GaSb, InP, InAs, InSb, ZnSe, ZnTe, CdTe, α-Sn, HgSe, HgTe and alloys of these semiconductor materials.

26. The device of claim 23, wherein the hole-doped semiconductor structure comprises a p-type semiconductor structure having a doping level of approximately $10^{16}$ to $10^{20}$ atoms/cm$^3$.

27. The device of claim 22, wherein the semiconductor structure comprises an undoped zero-gap semiconductor structure selected from the group of semiconductor materials with zero bandgap.

28. The device of claim 27, wherein the undoped zero-gap semiconductor structure comprises a semiconductor material selected from the group of α-Sn, HgTe and HgSe.

29. A circularly polarized light emitting device comprising:
 a quantum well structure coupled between a hole-doped semiconductor layer and an electron-doped semiconductor layer;
 the hole-doped semiconductor layer comprising a semiconductor material whose spin orbit coupling energy is greater than room temperature (300 Kelvin) times the Boltzmann constant and further comprising:
  a first electrode formed on a first end of the hole-doped semiconductor layer;
  a second electrode formed on a second end opposite the first end of the hole-doped semiconductor layer, the first end and the second end being disposed along the direction of a first axis; and
  a third electrode formed on a third end of the hole-doped semiconductor layer, the third end being disposed along the direction of a second axis perpendicular to the first axis and at the interface between the quantum well structure and the hole-doped semiconductor layer, the third electrode providing a spin-polarized current when an electric field is applied across the first and second electrodes,
 wherein the hole-doped semiconductor layer injects the spin-polarized hole current into the quantum well structure to be recombined with electrons provided by the electron-doped semiconductor layer to generate circularly polarized light.

30. The device of claim 29, wherein hole-doped semiconductor layer comprises a hole-doped semiconductor material of finite bandgap or zero bandgap.

31. The device of claim 29, wherein hole-doped semiconductor layer comprises a semiconductor material whose spin orbit coupling energy is greater than approximately 30 meV.

32. The device of claim 29, wherein the hole-doped semiconductor layer comprises a semiconductor material selected from the group of Si, Ge, AlAs, AlSb, GaP, GaAs, GaSb, InP, InAs, InSb, ZnSe, ZnTe, CdTe, α-Sn, HgSe, HgTe and alloys of these semiconductor materials.

33. The device of claim 29, wherein the hole-doped semiconductor layer comprises a p-type semiconductor layer having a doping level of approximately $10^{16}$ to $10^{20}$ atoms/cm$^3$.

34. A spin-current induced magnetic switching device, comprising:
 a layered structure comprising a first layer of a non-magnetic semiconductor layer, a second layer of a magnetic conducting material having a changeable magnetic moment and a third layer of a non-magnetic conductor wherein the first and third layers comprise electrodes for passing an electrical current through the layered structure along a first axis perpendicular to the interfaces between the layers; and
 a current supply connected to the first and third layers for passing an electric current through the first and second layers for switching the changeable magnetic moment of the second layer,
 wherein the semiconductor layer comprises a hole-doped semiconductor layer or an undoped zero-gap semiconductor layer and further comprises a semiconductor material whose spin orbit coupling energy is greater than room temperature (300 Kelvin) dimes the Boltzmann constant, the semiconductor layer comprising:
a first electrode formed on a first end of the semiconductor layer;
a second electrode formed on a second end opposite the first end of the semiconductor layer, the first end and the second end being disposed along the direction of a second axis perpendicular to the first axis; and
a third end being disposed along the direction of the first axis and at the interface between the first layer and the second layer,
wherein the semiconductor layer provides a spin-polarized current at the third end along the direction of the first axis when an electric field is applied across the first and second electrodes, the spin-polarized current having a spin polarization aligned in the direction of a third axis, the third axis being perpendicular to both the first axis and the second axis, which spin polarization flows through the first layer to the second layer for establishing a spin polarization of electrons in the second layer.

35. The device of claim 34, wherein the semiconductor layer comprises a hole-doped semiconductor layer having finite bandgap or zero bandgap.

36. The device of claim 34, wherein the semiconductor layer comprises a semiconductor material whose spin orbit coupling energy is greater than approximately 30 meV.

37. The device of claim 35, wherein the hole-doped semiconductor layer comprises a semiconductor material selected from the group of Si, Ge, AlAs, AlSb, GaP, GaAs, GaSb, InP, InAs, InSb, ZnSe, ZnTe, CdTe, α-Sn, HgSe, HgTe and alloys of these semiconductor materials.

38. The device of claim 35, wherein the hole-doped semiconductor layer comprises a p-type semiconductor layer having a doping level of approximately $10^{16}$ to $10^{20}$ atoms/cm$^3$.

39. The device of claim 34, wherein the current supply comprises a second applied electric field.

40. The device of claim 34, wherein the current supply comprises an applied voltage.

41. The device of claim 34, wherein the non-magnetic semiconductor layer comprises:
a fourth layer of a non-magnetic conductor disposed along the direction of the first axis coupled to the current supply; and
a fifth layer of a non-magnetic conductor disposed along the direction of the first axis coupled to the second layer of magnetic conducting material.

42. The device of claim 34, wherein the semiconductor layer comprises an undoped zero-gap semiconductor layer selected from the group of semiconductor materials with zero bandgap.

43. The device of claim 42, wherein the undoped zero-gap semiconductor layer comprises a semiconductor material selected from the group of α-Sn, HgTe and HgSe.

44. The device of claim 1, wherein the semiconductor structure comprises a hole-doped semiconductor layer of a semiconductor material whose spin orbit coupling energy is greater than room temperature (300 Kelvin) times the Boltzmann constant, the device further comprising:
a quantum well structure coupled between the hole doped semiconductor layer and an electron-doped semiconductor layer, the third end of the hole-doped semiconductor layer being disposed at the interface between the hole-doped semiconductor layer and the quantum well structure,
wherein the hole-doped semiconductor layer injects the spin-polarized hole current into the quantum well structure to be recombined with electrons provided by the electron-doped semiconductor layer to generate circularly polarized light.

45. The device of claim 1, wherein the semiconductor structure comprises a non-magnetic semiconductor layer, the device further comprising:
a layered structure comprising a first layer of the non magnetic semiconductor layer, a second layer of a magnetic conducting material having a changeable magnetic moment and a third layer of a non-magnetic conductor, the third end of the non-magnetic semiconductor layer being at the interface between the first layer and the second layer, wherein the first and third layers comprise electrodes for passing an electrical current through the layered structure along the second axis perpendicular to the interfaces between the layers; and
a current supply connected to the first and third layers for passing an electric current through the first and second layers for switching the changeable magnetic moment of the second layer,
wherein the semiconductor layer provides a spin-polarized current at the third end along the direction of the second axis when an electric field is applied across the first and second electrodes, the spin-polarized current having a spin polarization aligned in the direction of a third axis, the third axis being perpendicular to both the first axis and the second axis, which spin polarization flows through the first layer to the second layer for establishing a spin polarization of electrons in the second layer.

* * * * *